United States Patent [19]
Manning

[11] Patent Number: 6,137,146
[45] Date of Patent: *Oct. 24, 2000

[54] BIPOLAR TRANSISTOR AND METHOD OF FORMING BICMOS CIRCUITRY

[75] Inventor: Monte Manning, Boise, Id.

[73] Assignee: Micron Technology, Inc., Boise, Id.

[ * ] Notice: This patent is subject to a terminal disclaimer.

[21] Appl. No.: 09/072,700

[22] Filed: May 5, 1998

Related U.S. Application Data

[60] Continuation of application No. 08/696,244, Aug. 13, 1996, Pat. No. 5,757,052, which is a division of application No. 08/601,966, Feb. 15, 1996, Pat. No. 5,843,814.

[51] Int. Cl.$^7$ .......................... H01L 27/07; H01L 29/768

[52] U.S. Cl. .......................... 257/378; 257/565; 257/552

[58] Field of Search .................... 257/378, 565, 257/552, 556, 557

[56] References Cited

U.S. PATENT DOCUMENTS

| | | |
|---|---|---|
| 4,344,081 | 8/1982 | Pao et al. ................................. 257/378 |
| 4,395,812 | 8/1983 | Bergeron et al. ....................... 438/189 |
| 4,441,117 | 4/1984 | Zommer .................................. 257/378 |
| 4,529,456 | 7/1985 | Anzai et al. . |
| 4,764,482 | 8/1988 | Hsu .......................................... 437/59 |
| 4,829,200 | 5/1989 | Downey .................................. 257/378 |
| 4,855,245 | 8/1989 | Neppl et al. ........................ 148/DIG. 9 |
| 5,001,073 | 3/1991 | Huie .................................. 148/DIG. 9 |
| 5,028,977 | 7/1991 | Kenneth et al. ....................... 257/378 |
| 5,066,602 | 11/1991 | Takemoto et al. ..................... 438/234 |
| 5,330,922 | 7/1994 | Erdeljac et al. ................. 148/DIG. 13 |
| 5,336,926 | 8/1994 | Matthews . |
| 5,374,569 | 12/1994 | Yilmaz et al. ..................... 148/DIG. 9 |
| 5,407,841 | 4/1995 | Liao et al. .............................. 438/234 |
| 5,422,509 | 6/1995 | Zambrano .............................. 257/378 |
| 5,504,364 | 4/1996 | Chang et al. . |
| 5,757,052 | 5/1998 | Manning ................................. 257/378 |

OTHER PUBLICATIONS

Kumar et al., "Realization and Performance of LDBIMOS Transistor", Industry Application of LDBIMOS Transistor, p1135–40, 1992.

*Primary Examiner*—Tom Thomas
*Assistant Examiner*—Shouxiang Hu
*Attorney, Agent, or Firm*—Wells, St. John, Roberts, Gregory & Matkin P.S.

[57] ABSTRACT

A method of forming BiCMOS circuitry includes, i) conducting a first common second conductivity type implant into, a) a first substrate area to comprise a second conductivity type well for a first area first conductivity type FET, and b) a third substrate area to comprise one of a bipolar transistor second conductivity type collector or emitter region; ii) providing field oxide regions and active area regions within first, second and third areas of the substrate; iii) conducting a first common first conductivity type implant into, a) the second substrate area to comprise a first conductivity type channel stop region beneath field oxide in the second area, and b) the third substrate area to comprise the bipolar transistor base; and iv) conducting a second common second conductivity type implant into, a) at least one of the first or the second substrate areas to comprise at least one of a source/drain implant or a graded junction implant for at least one of the first or second conductivity type FETs, and b) the third substrate area to comprise the other of the second conductivity type collector or emitter regions. A bipolar transistor includes, i) a conductively doped collector region, a conductively doped base region and a conductively doped emitter region; the collector region comprising a doped contact region having a higher dopant concentration than a majority of the remaining portion of the collector region; and ii) an isolation gate positioned between the emitter region and the collector contact region.

16 Claims, 6 Drawing Sheets

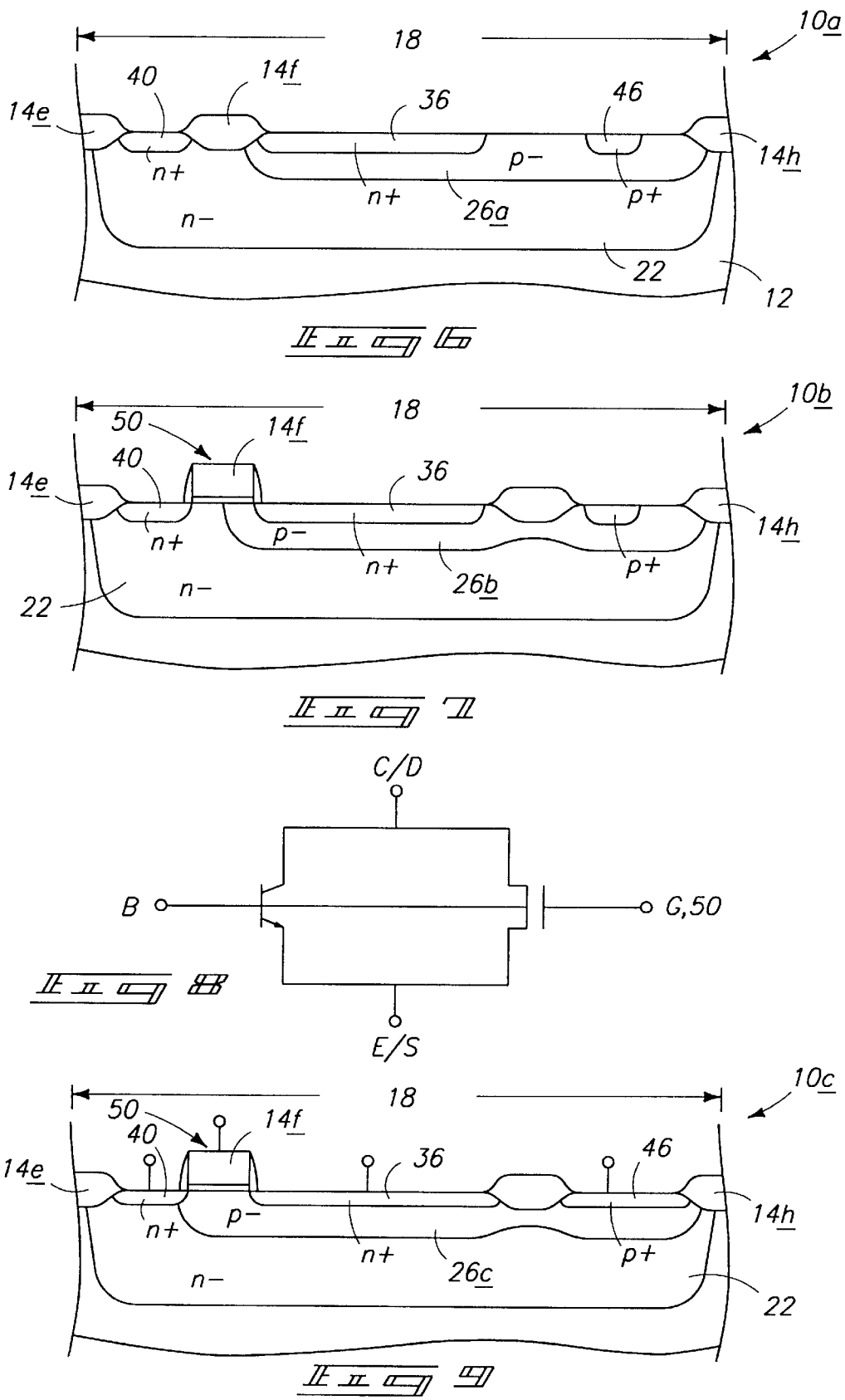

6,137,146

BIPOLAR TRANSISTOR AND METHOD OF FORMING BICMOS CIRCUITRY

RELATED PATENT DATA

This patent resulted from a continuation application of U.S. patent application Ser. No. 08/696,244, filed Aug. 13, 1996, now U.S. Pat. No. 5,757,052 which is a divisional application of U.S. patent application Ser. No. 08/601,966, filed on Feb. 15, 1996, now U.S. Pat. No. 5,843,814, entitled "Bipolar Transistor and Method of Forming BiCMOS Circuitry", listing the inventor as Monte Manning.

TECHNICAL FIELD

This invention relates to bipolar transistors and to methods of forming BiCMOS circuitry.

BACKGROUND OF THE INVENTION

As MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

BiCMOS circuitry provides speed improvements over standard CMOS circuitry. Such employs bipolar transistors in addition to CMOS field effect transistors. The speed improvement results from the much higher current that bipolar devices can provide in a smaller space. In typical prior art BiCMOS processes, additional masking steps are utilized in either a standard bipolar process or a standard CMOS process to add-in the complementary bipolar or MOS devices. Specifically in adding a bipolar device to a CMOS process, one or more of the bipolar sub-collector contact, base region or emitter region must be added to a CMOS flow. These additions typically involve from three to 5 additional masking steps and associated process complexity with etches, implants, and film depositions.

It would be desirable to reduce these process complexities and provide BiCMOS processes having reduced masking steps.

BRIEF DESCRIPTION OF THE DRAWINGS

Preferred embodiments of the invention are described below with reference to the following accompanying drawings.

FIG. 6 is a sectional view of an alternate embodiment semiconductor wafer fragment processed in accordance with the invention.

FIG. 7 is a sectional view of another semiconductor wafer fragment processed in accordance with aspects of the invention.

FIG. 8 is a schematic of the FIG. 7 construction.

FIG. 9 is a sectional view of yet another embodiment semiconductor wafer fragment processed in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming BiCMOS circuitry comprises the following steps:

providing a first area on a first conductivity type semiconductor substrate for formation of a first conductivity type FET, providing a second area on the semiconductor substrate for formation of a second conductivity type FET, and providing a third area on the semiconductor substrate for formation of a bipolar transistor, the bipolar transistor comprising opposing second conductivity type collector and emitter regions and an intervening first conductivity type base region, the FETs comprising respective channel and opposing source/drain regions;

conducting a first common second conductivity type implant into, a) the first substrate area to comprise a second conductivity type well for the first area first conductivity type FET, and b) the third substrate area to comprise one of the bipolar transistor second conductivity type collector or emitter regions;

providing field oxide regions and active area regions within the first, second and third areas of the substrate;

conducting a first common first conductivity type implant into, a) the second substrate area to comprise a first conductivity type channel stop region beneath field oxide in the second area, and b) the third substrate area to comprise the bipolar transistor base; and conducting a second common second conductivity type implant into, a) at least one of the first or the second substrate areas to comprise at least one of a source/drain implant or a graded junction implant for at least one of the first or second conductivity type FETs, and b) the third substrate area to comprise the other of the second conductivity type collector or emitter regions.

In accordance with another aspect of the invention, a bipolar transistor formed relative to a semiconductor substrate comprises:

a conductively doped collector region, a conductively doped base region and a conductively doped emitter region; the collector region comprising a doped contact region having a higher dopant concentration than a majority of the remaining portion of the collector region; and an isolation gate positioned between the emitter region and the collector contact region.

Figure 1:
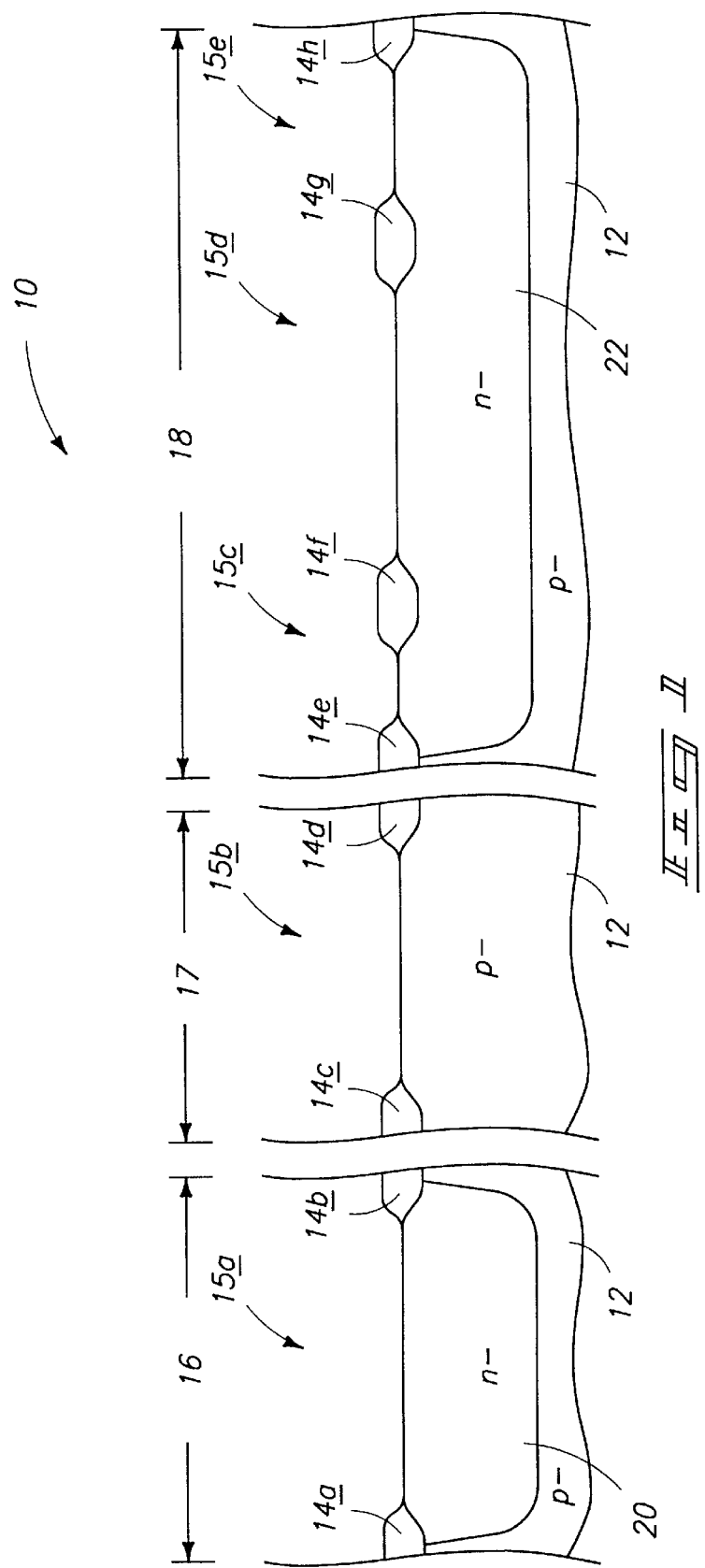
FIG. 1 is a fragmentary sectional view of a semiconductor wafer fragment at one processing step in accordance with the invention.

These and other aspects of the invention will be appreciated from the following description which proceeds relative to the accompanying drawings. Specifically, FIG. 1 illustrates a semiconductor wafer fragment indicated generally by reference numeral 10. Such comprises a bulk monocrystalline silicon substrate 12 provided with a first substrate area 16, a second substrate area 17, and a third substrate area 18. First substrate area 16 will be utilized for formation of a first conductively type field effect transistor (FET). Second substrate area 17 will be utilized for formation of a second conductivity type (FET), and third substrate area 18 will be utilized for formation of a bipolar transistor. For purposes of the continuing discussion, the bipolar transistor will comprise opposing second conductivity type collector and emitter regions and an intervening first conductivity type base region. The respective FETs will comprise respective channel and opposing source/drain diffusion regions.

The drawings depict the first conductivity type as being "p" with the second conductivity type being "n", although these may be reversed with the invention only being limited by the accompanying claims appropriately interpreted in accordance with the Doctrine of Equivalent. Monocrystalline silicon substrate 12 in this example would be provided to a background p− concentrations of for example $1 \times 10^{16}$ atoms/cm$^3$, thus rendering the substrate in the example to be of the first conductivity type.

Field oxide regions 14a, 14b, 14c, 14d, 14e, 14f, 14g, 14h and active area regions 15a, 15b, 15c, 15d, 15e are provided in association with the first, second and third substrate areas as shown. The discussion proceeds with reference to formation of a single transistor within each area, although the artisan will appreciate that millions of such transistors would typically be provided in accordance with conventional semiconductor processing practices.

Still referring to FIG. 1, a first common second conductivity type implant is provided into first substrate area 16 to comprise a second conductivity type background well 20 for the first area first conductivity type FET being produced, and into third substrate area 18 to comprise an implant region 22 which will comprise one of the bipolar transistor second conductivity type collector region or emitter region. In the described embodiment, region 22 will comprise the collector region. Preferably, the first common second conductivity type implant to produce regions 20 and 22 will be conducted prior to formation of field oxide regions 14. During such first common second conductivity type implant, all of second substrate area 17 is masked to prevent such implanting thereinto. An example implant dose to produce the illustrated first conductivity type/n− regions 20 and 22 is $1 \times 10^{13}$ atoms/cm$^2$ (phosphorus), to produce a resultant average implant concentration of $2 \times 10^{17}$ atoms/cm$^3$. Typically, the implant is then subjected to a high temperature anneal to drive the dopant deeper into the substrate (e.g., 1200° C. for 4 hours to drive it 4 microns deep).

Figure 2:
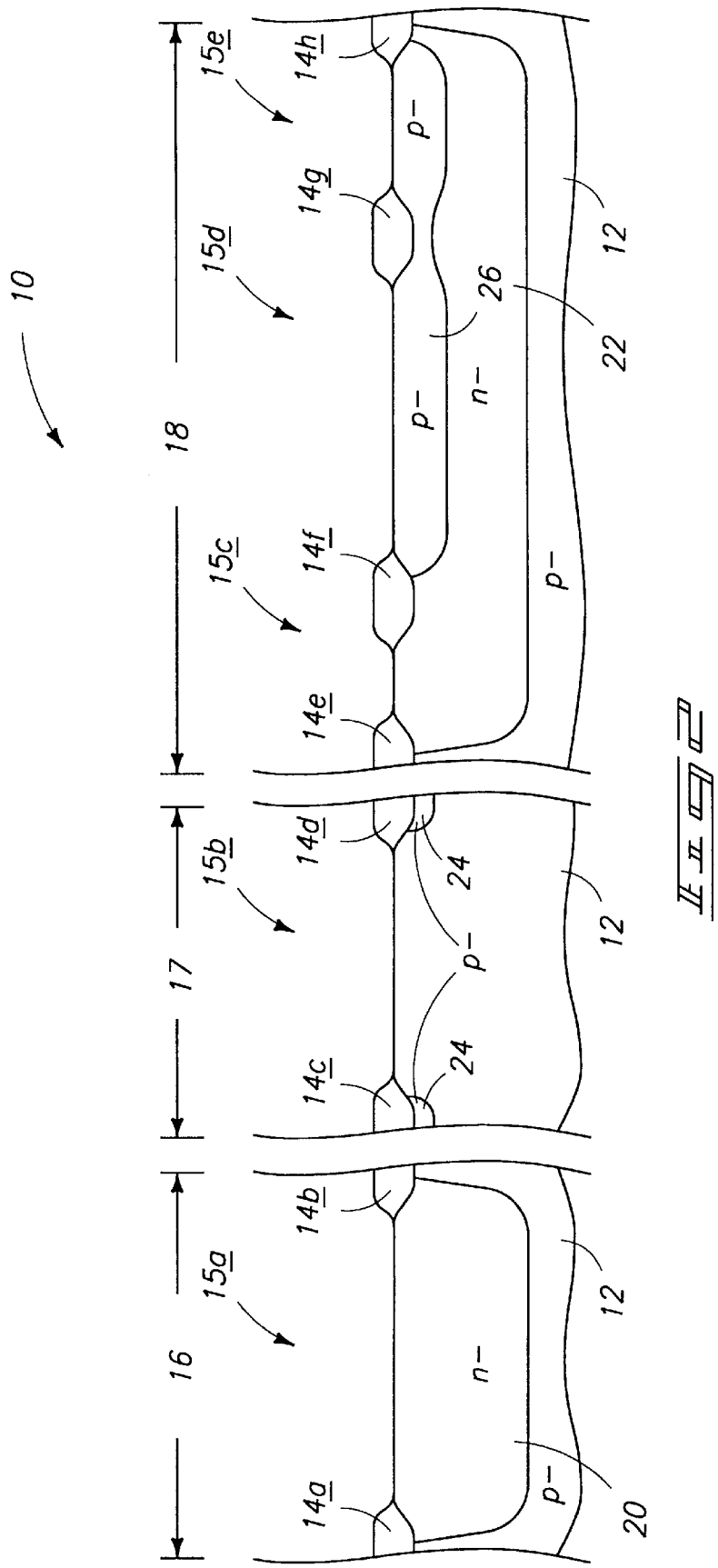
FIG. 2 is a view of the FIG. 1 wafer fragment at a processing step subsequent to that shown by FIG. 1.

Referring to FIG. 2, a first common first conductivity type implant is conducted into, a) second substrate area 17 to comprise a first conductivity type channel stop region 24 beneath field oxide 14c and 14d within second area 17, and b) third substrate area 18 to comprise a bipolar transistor base region 26. During such implanting, active area regions 15b and 15c, and all of first substrate area 16, are masked to prevent such first conductivity type implant. An example and typical implant dose for regions 24 and 26 is from about $1 \times 10^{12}$–$10 \times 10^{13}$ atoms/cm$^2$. An example implant energy is 150 keV such that it penetrates the isolation oxide regions.

As shown, such implant will be provided at a depth slightly greater into substrate 12 over the active area regions than over the field oxide regions. After subsequent thermal treatments, the final depth of base region 26 will thereby effectively be defined by the diffused channel stop implant. For example where the field oxide thickness is 3500 Angstroms, the implant to produce regions 24 and 26 can be conducted using Boron at a dose of $3.0 \times 10^{12}$ atom/cm$^2$ at 150 keV. With subsequent thermal treatments equivalent to 900° C. for 60 minutes, the final first conductivity type/p−base region junction depth within the collector/n-well 22 would be about 0.5 micron.

Figure 3:
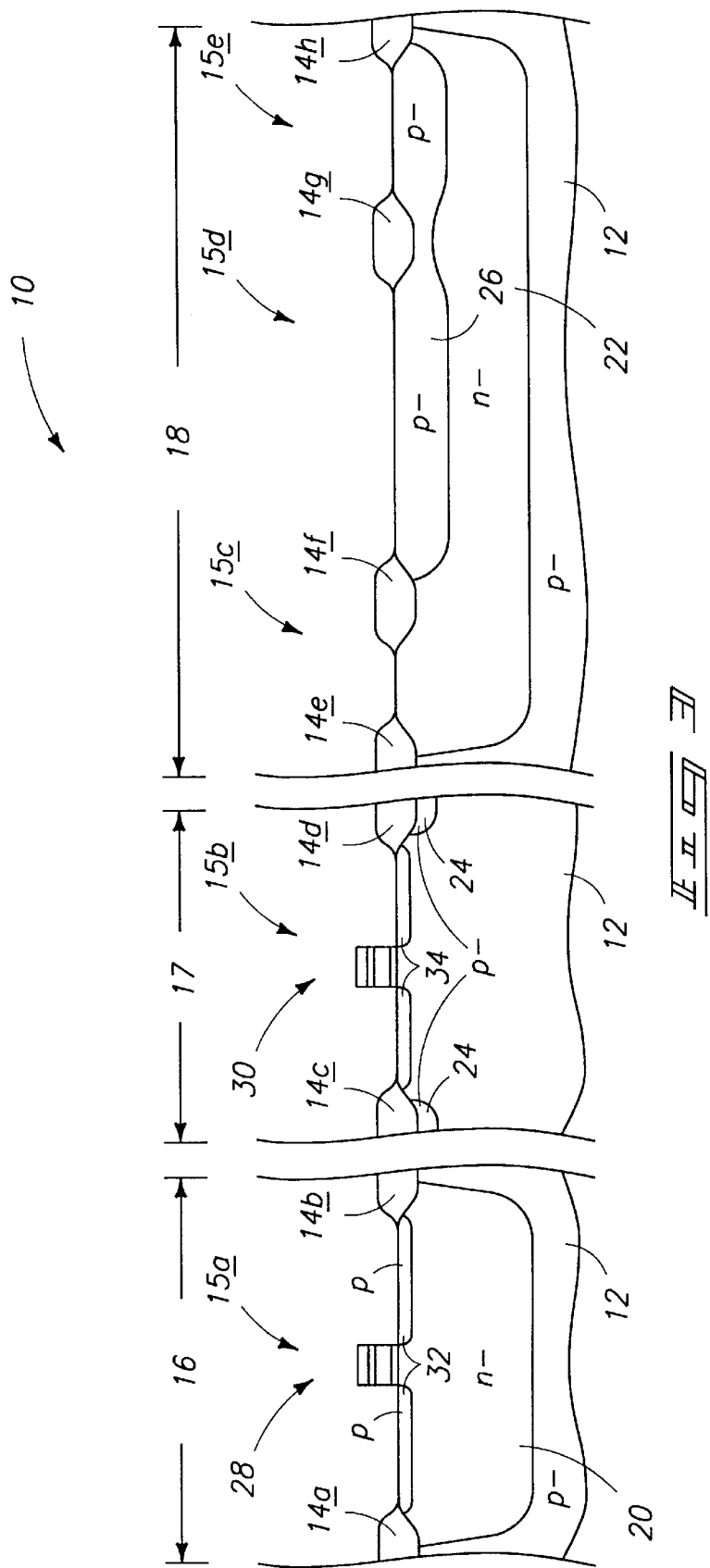
FIG. 3 is a view of the FIG. 1 wafer fragment at a processing step subsequent to that shown by FIG. 2.

Referring to FIG. 3, a transistor gate stack 28 is provided within first substrate area 16 for the first conductivity type FET, and a gate stack 30 is provided within second substrate area 17 for the second conductivity type FET. Such a construction comprises a gate dielectric layer, an overlying conductively doped polysilicon layer, an overlying silicide layer, and a capping insulating layer. A second common first conductivity type implant is conducted into, a) first substrate area 16 to comprise first conductivity type LDD regions 32 for the first conductivity type FET, b) second substrate area 17 to comprise first conductivity type halo regions 34 for the second conductivity type FET, and c) third substrate area 18 to further comprise a portion of bipolar transistor base implant region 26. This may also be a masked implant where the implant only goes into 17, 15d and 15e. An additional masked implant can be used for a p-channel LDD implant going into 16 and other regions.

An example implant energy is for the FIG. 3 implant is 40 keV (boron), with an example dose being from about $5 \times 10^{11}$–$5 \times 10^{13}$ atoms/cm$^2$. Added to the preferred implant range to produce regions 24 and 26 initially, this will provide a preferred total dose for region 26 of $1.5 \times 10^{12}$–$6 \times 10^{13}$ atoms/cm$^2$. Further, a first conductivity type threshold voltage adjust implant ($V_t$) can be provided relative to first area 16 and second area 17 and simultaneously into third substrate area 18, as desired, to further increase the dopant concentration of bipolar based region 26. Though the subject first type implant also would typically go into region 15c, subsequent opposite second type doping of region 15c will be greater in degree such that a first type region is not ultimately formed or shown in region 15c.

Figure 4:
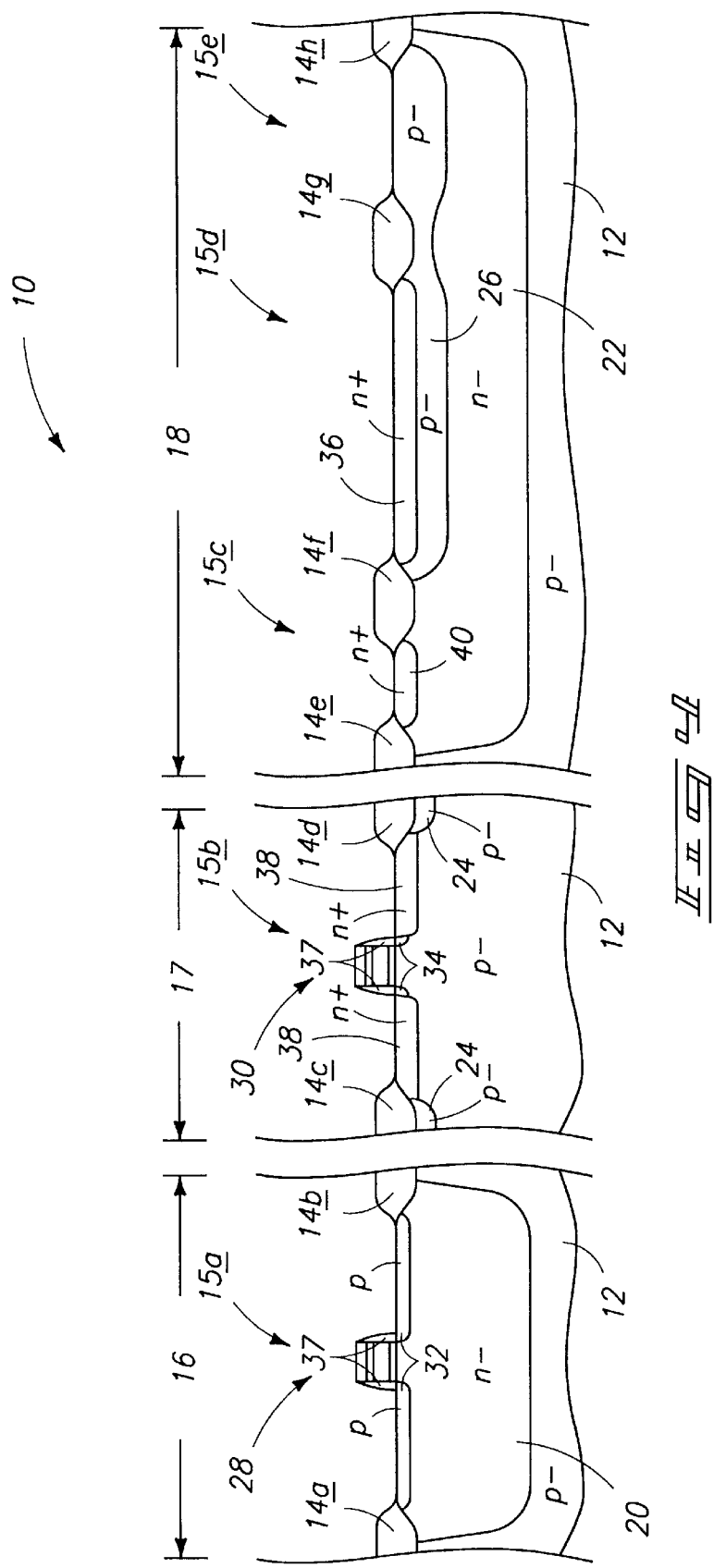
FIG. 4 is a view of the FIG. 1 wafer fragment at a processing step subsequent to that shown by FIG. 3.

Referring to FIG. 4, a second common second conductivity type implant is conducted into, a) at least one of first substrate area 16 or second substrate area 17 to comprise at least one of a source/drain implant or a graded junction implant for at least one of the first or second conductivity type FETs, and b) third substrate area 18 to comprise the other of the second conductivity type collector or emitter region 36. In the preferred and illustrate embodiment, sidewall spacers 37 are previously provided about gate constructions 28 and 30. All of first substrate area 16 and active area 15e are masked during the second common second conductivity type implant such that second conductivity type source/drain regions 38 are provided relative to second substrate area 17. An example implant 36/38 energy is 30 keV (arsenic), with an example dose being from about $5 \times 10^{14}$–$1 \times 10^{16}$ atoms/cm$^2$, with $3 \times 10^{15}$ atoms/cm$^2$ being typical.

Yet assuming, for example, an n+ emitter region 36 junction depth of about 0.18 micron, and a base width of about 3000 Angstroms, it may be desirable to restrict the n+/second conductivity type concentration within region 36. Accordingly, it may be desirable to block/mask active area 15d within third substrate area 18 during the heavy dose implant to produce second conductivity type source/drain regions 38. Accordingly, emitter region 36 in such instances might constitute or result from a second conductivity type graded junction implant for either first substrate area 16 (i.e., a halo implant for PMOS) or second substrate area 17 (i.e., an LDD graded junction implant for the NMOS or second conductivity type FET).

Further preferred and as shown, a high dose second conductivity type contact region 40 (i.e., a dose of $3 \times 10^{15}$ atoms/cm$^2$) is provided within the one bipolar transistor collector or emitter region 22 in active area 15c. Accordingly, active area region 15c is left unmasked during and results from the second common second conductivity type implant where region 40 and a region 36 result from a common implant in association with the second conductivity type implant to produce source/drain regions 38. Ultimately but less preferred, contact region 40 could be provided in some separate implant not constituting the second common second conductivity type implant.

Figure 5:
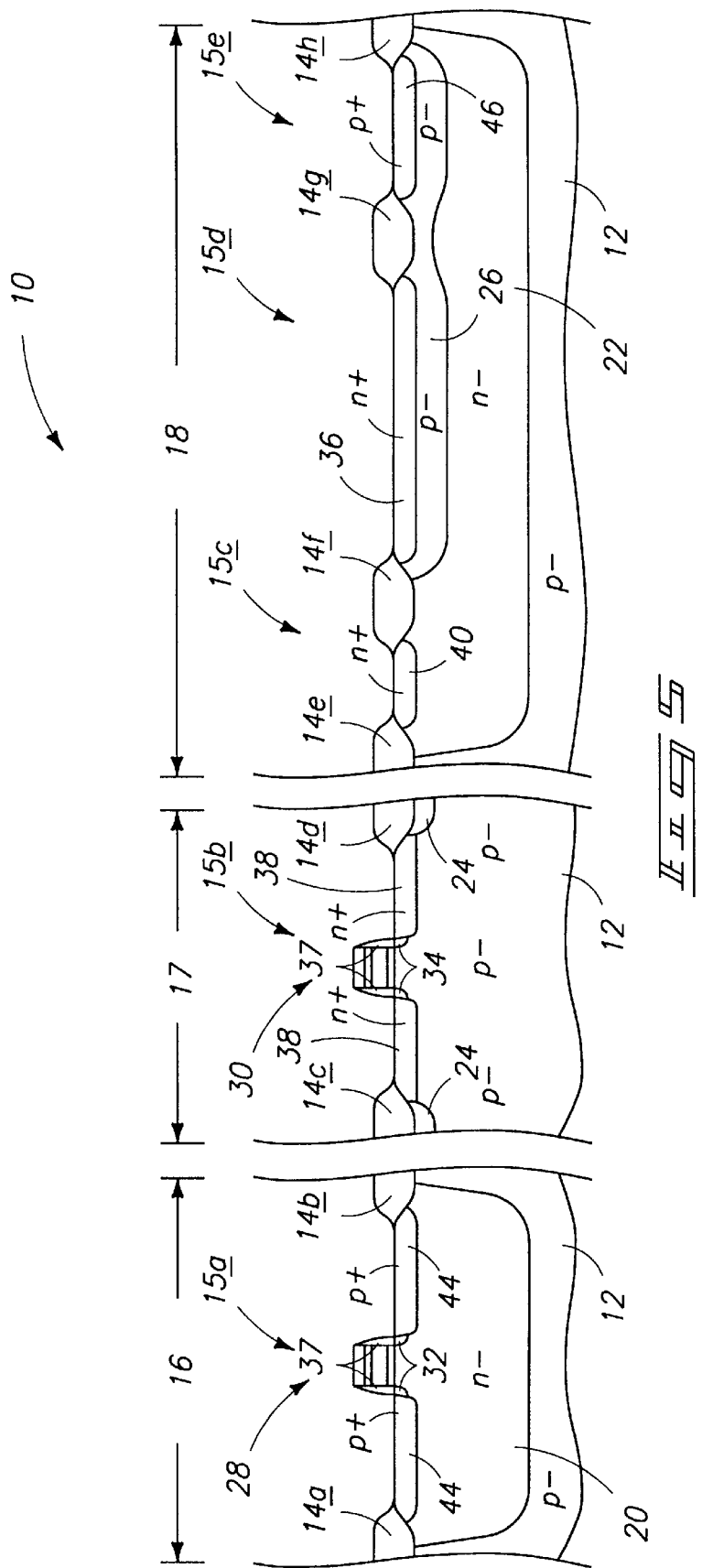
FIG. 5 is a view of the FIG. 1 wafer fragment at a processing step subsequent to that shown by FIG. 4.

Referring to FIG. 5, second substrate area 17 and active areas 15c and 15d are masked, and the substrate subjected to another common first conductivity type implant. Such produces first substrate area 16 source/drain regions 44, and a first conductivity type contact region 46 in base region 26 of third substrate area 18. An example implant dose is $1 \times 10^{15}$ atoms/cm$^2$ BF$_2$. Both substrate contact regions 40 and 46 facilitate respective ohmic electrical contact connection relative to the respective collector and base regions. Region 46 has a higher first conductivity type dopant concentration than remaining portions of region 26.

In the depicted and described embodiment, field oxide region 14g is provided between first conductivity type contact region 46 and emitter region 36 for providing desired effective isolation therebetween. Alternately but less preferred, such field oxide region can be removed, such as is shown with an alternate embodiment region 18 in FIG. 6. Like numerals from the first described embodiment are utilized where appropriate, with differences being indicated by the suffix "a" or with different numerals. The FIG. 6 embodiment may enable the base to be placed in close proximity to the emitter which will reduce annihilation of minority carriers in the base while in transit from the emitter. However, the drawback to this approach is increased junction leakage.

The above described preferred embodiments facilitate or enable reduction or elimination of dedicated masking steps in prior art BiCMOS processes. In otherwords, a process can be provided for forming complementary first and second conductivity type FETs relative to a semiconductor substrate using a set number of photomasking steps. While such complementary first and second conductivity type FETs are being produced, a bipolar transistor can be simultaneously formed relative to the semiconductor substrate using and without adding to the set number of masking steps for forming the complementary first and second conductivity type FETs. Further and regardless, the above described preferred embodiments of forming BiCMOS circuitry conducts a common conductivity modifying implant into the substrate to form, a) one implant region 24 comprising a FET channel stop implant beneath field oxide, and b) another implant region 26 comprising a base of a bipolar transistor, contrary to prior art methodical teachings.

Yet another alternate embodiment is shown with respect to FIG. 7. Like numerals from the first described embodiment are utilized where appropriate, with differences being indicated by the suffix "b" or with different numerals. Here, field oxide region 14g that previously separated collector contact 40 from emitter 36 has been replaced with a FET isolation gate 50. This results in the addition of a parallel NMOS/first conductivity type device between collector 22, C and emitter 36, E (FIG. 8) with its substrate body being tied to bipolar transistor base 26, B. This can provide an additional current drive from emitter 36 (source) to collector 22 (drain) at low base biases. When base voltage rises, the threshold voltage of the NMOS/first conductivity type device falls, and current flows depending upon the gate bias and threshold voltage of the device.

This first conductivity type NMOS device will have a lower threshold voltage than standard NMOS devices since it is in an n-well that has been counter-doped with channel stop and perhaps other first conductivity type implants. Further, a surface n-region may be provided under gate 50, resulting in a buried channel, low $V_t$ device. With gate voltage kept low, such a buried region should be depleted of mobile charge so a parasitic current will not flow between the emitter and collector. Current leakage is not anticipated to be a problem as all n/p junctions are passivated at the Si/SiO$_2$ interface with a grown oxide.

FIG. 7 depicts an embodiment wherein base region 26b extends only partially beneath isolation gate 50. FIG. 9 shows an alternate embodiment wherein a base region 26c extends completely beneath isolation gate 50, and joins with collector contact region 40. This should not change the functionality of the bipolar device where spacing between emitter 36 and collector 22 is greater than the base 26c width under middle region 36.

Further, many CMOS processes use both phosphorous and arsenic as n-well dopant materials. To increase the effectiveness of the counter-doping, it may be desirable to mask one of the arsenic or phosphorous implants from the bipolar regions. This would reduce the dopant concentration at the silicon surface, and make the base width thicker if desired. Such would, however, invoke an additional non-critical mask.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A bipolar transistor formed relative to a semiconductor substrate comprising:

a conductively doped collector region, a conductively dopes base region and a conductively doped emitter region, the base region being either a p-type region or an n-type region, the collector region being the other of the p-type region or the n-type region, the collector region extending beneath the base region; the collector region comprising a collector contact region having a higher dopant concentration than a majority of the remaining portion of the collector region; and an isolation gate positioned between the emitter region and the collector contact region, the isolation gate having opposing sidewall edges and an upper surface that is at a constant elevation between the opposing edges, the emitter region and the collector contact region having edges aligned with the opposing edges of the isolation gate.

2. The bipolar transistor of claim 1 wherein the base region extends beneath the isolation gate.

3. The bipolar transistor of claim 1 wherein the base region extends only partially beneath the isolation gate.

4. The bipolar transistor of claim 1 wherein the base region extends completely beneath the isolation gate.

5. The bipolar transistor of claim 1 wherein the base region extends completely beneath the isolation gate and joins with the collector contact region.

6. The bipolar transistor of claim 1 wherein the isolation gate is electrically coupled to the base.

7. A bipolar transistor formed relative to a semiconductor substrate comprising:
   a conductively doped collector region, a conductively doped base region and a conductive doped emitter region; the collector region comprising a collector contact region having a higher dopant concentration than a majority of the remaining portion of the collector region;
   an isolation gate positioned between the emitter region and the collector contact region, the isolation gate having sidewalls aligned with edges of the emitter and collector contact regions; and
   the base region extending entirely beneath the isolation gate and not extending entirely beneath the collector contact region.

8. The bipolar transistor of claim 7 wherein the isolation gate is electrically coupled to the base.

9. A bipolar transistor formed relative to a semiconductor substrate comprising:
   a conductively doped collector region, a conductively doped base region and a conductively doped emitter region, the base region being either a p-type region or an n-type region, the collector region being the other of the p-type region or the n-type region, the collector region extending to beneath the base region; and
   an isolation gate positioned between the emitter region and the collector region and having a pair of opposing edges and an upper surface, the upper surface being at a same elevation at one opposing edge as the other of the pair of opposing edges, the base region extending entirely beneath the isolation gate.

10. The bipolar transistor of claim 9 wherein the isolation gate is electrically coupled to the base.

11. A bipolar transistor formed relative to a semiconductor substrate comprising:
    a conductively doped collector region, a conductively doped base region and a conductively doped emitter region formed in the isolation well, the base region being either a p-type region or an n-type region, the collector region being the other of the p-type region or the n-type region and being of opposite conductivity type than the substrate, the collector region extending to beneath the base region; and
    an isolation gate positioned between the emitter region and the collector contact region, the isolation gate having opposing sidewall edges and an upper surface that is at a constant elevation between the opposing edges, the emitter region and the collector contact region having edges aligned with the opposing edges of the isolation gate.

12. The bipolar transistor of claim 11 wherein the base region extends beneath the isolation gate.

13. The bipolar transistor of claim 11 wherein the base region extends only partially beneath the isolation gate.

14. The bipolar transistor of claim 11 wherein the base region extends completely beneath the isolation gate.

15. The bipolar transistor of claim 11 wherein the base region extends completely beneath the isolation gate and joins with the collector contact region.

16. The bipolar transistor of claim 11 wherein the isolation gate is electrically coupled to the base.

* * * * *

UNITED STATES PATENT AND TRADEMARK OFFICE
CERTIFICATE OF CORRECTION

PATENT NO. : 6,137,146
DATED : October 24, 2000
INVENTOR(S) : Monte Manning, et al It is certified that error appears in the above-identified patent and that said Letters Patent are hereby corrected as shown below:

Col. 1, Line 20   Replace "As" with --An--

Col. 3, Line 28   Replace "Equivalent" with --Equivalents--

Col. 4, Line 3    Replace "$1x10^{13}-10x10^{13}$" with --$1x10^{12}-1x10^{13}$--

Col. 5, Line 43   Replace "close" with --closer--

Col. 6, Line 3    Replace "14$g$" with --14$f$--

Col. 6, Line 55   Replace "dopes" with --doped--

Col. 7, Line 18   Replace "conductive" with --conductively--

Col. 8, Line 19   Delete "to" before the word --beneath--

Signed and Sealed this

Twenty-second Day of May, 2001

Attest:

NICHOLAS P. GODICI

Attesting Officer    Acting Director of the United States Patent and Trademark Office